United States Patent [19]

Katz et al.

[11] 3,891,439

[45] June 24, 1975

[54] AQUEOUS DEVELOPING COMPOSITION FOR LITHOGRAPHIC DIAZO PRINTING PLATES

[75] Inventors: Leon Katz, Springfield; William Rowe, Westfield, both of N.J.; Eugene Golda, Monsey, N.Y.

[73] Assignee: Polychrome Corporation, Yonkers, N.Y.

[22] Filed: Nov. 2, 1972

[21] Appl. No.: 303,071

[52] U.S. Cl. .......................... 96/49; 96/33; 96/35.1; 96/48 R; 101/465; 101/467; 252/351; 252/352; 252/353; 252/356; 252/358; 260/309.6

[51] Int. Cl. ........................... G03c 5/34; G03f 7/08

[58] Field of Search ........... 96/33, 48 R, 48 PD, 49, 96/66, 114.5; 101/465, 466, 456; 252/351, 352, 353, 356, 358; 260/309.6

[56] References Cited

UNITED STATES PATENTS

| | | | |
|---|---|---|---|
| 2,512,435 | 6/1950 | Mitchell et al. | 252/353 X |
| 2,660,568 | 11/1953 | Cunder et al. | 252/353 X |
| 2,820,043 | 1/1958 | Rainey et al. | 260/309.6 |
| 3,091,533 | 5/1963 | Hodgins | 96/33 X |
| 3,113,026 | 12/1963 | Sprung | 96/114.5 X |
| 3,471,289 | 10/1969 | Herrick | 96/33 |
| 3,555,041 | 1/1971 | Katz | 260/309.6 |
| 3,637,384 | 1/1972 | Deutsch | 96/33 X |
| 3,660,097 | 5/1972 | Mainthia | 96/33 X |
| 3,679,419 | 7/1972 | Gillich | 96/33 X |
| 3,751,257 | 8/1973 | Dahlman | 96/33 X |
| 3,819,647 | 6/1974 | Foley | 260/309.6 |
| 3,840,553 | 10/1974 | Neel et al. | 260/309.6 |

OTHER PUBLICATIONS

Grant, J., "Hackh's Chemical Dictionary," 4th Ed., 1969, pp. 392–393.

*Primary Examiner*—Charles L. Bowers, Jr.

[57] ABSTRACT

A developer composition for photosensitive coatings on substrates, particularly lithographic printing plates sensitized with substantially water-insoluble diazonium compounds, which is comprised of an aqueous solution of an amphoteric surfactant and a substantially water-soluble organo-lithium salt, e.g., lithium naphthenate, lithium benzoate, lithium ricinoleate, etc. The novel developers quickly remove non-image areas of the plate and yet do not detrimentally dissolve the image areas of the plate.

21 Claims, No Drawings

AQUEOUS DEVELOPING COMPOSITION FOR LITHOGRAPHIC DIAZO PRINTING PLATES

This invention relates to a developing system for photosensitive coatings on substrates, particularly diazo-sensitized photosensitive coatings on substrates, e.g., lithographic printing plates, and more particularly to compositions for developing an exposed lithographic plate to remove non-image areas and to prepare the plate for press.

Lithographic printing utilizes the immiscibility between oleophilic inks and an aqueous dampening fluid on a substantially planar printing plate surface. An oleophilic image area that corresponds to an image to be printed is formed on a plate, and the remainder of the plate surface, the non-image area, is or is made hydrophilic in character. The image area accepts greasy ink and transfers the ink during printing; the non-image area is kept damp with water or an aqueous dampening fluid and repels the ink so that no printing occurs from that area. To form such a printing plate, a flat base surface is coated with a very thin layer of a light-sensitive material and exposed to light through a transparent film having opaque areas. A negative transparency of the image desired to be reproduced is used for exposing a so-called negative-acting plate, and a positive transparency is used for exposing a so-called positive-acting plate. Light passes through the clear areas of the negative transparency, which correspond to the image, and causes a reaction in the light-sensitive coating on the underlying plate that "hardens" the coating in the image area. Light does not pass through the opaque areas of the transparency, however, so that the light-sensitive coating on the plate underlying such areas remains unaffected. The plate is then developed by removing the coating from the plate in unexposed areas, which are hydrophilic, or are then made hydrophilic. The positive-acting plate differs from the negative-acting plate in that in the former the light passing through the clear areas of the causes transparency cuases the light-sensitive coating on the underlying plate to decompose to some extent, thereby resulting in a solubility differential between image and non-image areas. The exposed areas of the positive-acting plate are removed.

In the past negative working diazo-sensitized lithographic plates have generally been developed with solvents. Some of the solvents used have been isopropyl alcohol, normal propyl alcohol, Cellosolve (ethylene glycol monoethyl ether), butyl alcohol, benzyl alcohol etc. Some developers consist essentially of organic solvents whereas others contain water in addition to the organic solvents. In either the organic solvent type or the aqueous type, aromatic sulfonic acids or their sodium salts have been used. These developers have suffered from one or more disadvantages when used to develop some negative working diazo-sensitized lithographic plates. For example, a mixture of 20% normal propyl alcohol and 80% water, when used to develop some lithographic plates, has a tendency to overdevelop the plates because of narrow solubility differential between image and non-image areas.

Sulfonic acids have been used in developers, but they have several disadvantages. They are more corrosive than the developer compositions of this invention and when used in a developing machine will tend to corrode its bearings, piping and other metallic parts. Perhaps because of this corrosive nature and its effect on image areas, plates developed with developers containing sulfonic acids do not print as many copies as those developed with the developers of this invention. Surfactant-type wetting agents are preferred in many formulations. Sulfonic acids, e.g., 2-hydroxy -4-methoxy-benzophenone-5-sulfonic acid, tend to decompose and precipitate surfactant-type wetting agents in developer compositions. Those same wetting agents result in undesirable foaming when used in developing machines. The aforementioned sulfonic acid is an ultraviolet light absorber; and as it absorbs, it discolors. Consequently, an actinic-absorbing material must be used as the material for bottles containing it.

Developers containing sodium salts of sulfonic acids and solvents such as glycols instead of surfactant-type wetting agents were found to leave a dirty background when used to machine-develop plates. To clean the background it was necessary to increase the concentration of the sodium salt of the sulfonic acid, but that resulted in a grey scale decreased by about 2 steps, i.e., the dots in the half-tone on the plate were smaller than in the transparency used in exposing it. In contrast the developers of this invention work well without added wetting agents or solvents, leave a clean background on the plate and do not reduce the grey scale.

It has been found that half-tone dots on an exposed plate are attacked and sharpened most by solvents, and then by sulfonic acids and their sodium salts in that decreasing order. Use of developers of this invention results in little, if any, attack on and sharpening of half-tone dots.

The aforementioned disadvantages of the prior art are elminated or minimized by the developers of this invention.

It is an object of this invention to provide an improved developing system for lithographic printing plates. A more particular object of this invention is to provide an improved developer composition for removing non-image areas from lithographic printing plates on which the light-sensitive agent in the coating thereon is a substantially water-insoluble diazonium compound.

The foregoing objects and others which will be apparent from the following description are achieved through use of our aqueous developing compositions containing an amphoteric surfactant and a substantially water-soluble organolithium salt that readily removes from exposed lithographic plates the non-image areas of the light-sensitive coating in which the light-sensitive component is a diazonium compound or a photopolymer, particularly a substantially water-insoluble diazonium compound. Generally, the developer composition is comprised of water, an amphoteric surfactant and a substantially water-soluble organo-lithium salt as hereinafter illustrated. In some developer compositions of this invention, wetting agents and other components may be utilized in the composition to decrease the time required for development of the lithographic plate or to modify other characteristics of the developer compositions.

One of the important types of known negative-acting diazo components utilized in lithographic plates is comprised of reaction products of a light-sensitive diazo-containing compound and a coupling agent, which reaction products retain their light-sensitivity. The reaction products, however, generally have less water-solubility than either of their components, and generally tend to be substantially insoluble in water. Thus, while such reaction products can conveniently be coated onto bases from solvent and even from dilute aqueous solutions to make plates, their development by aqueous developers is difficult because of the relative insolubility in water or the lack of sufficient selective solubility between exposed and unexposed areas—so-called differential—in solvents.

The light-sensitive diazo-containing components of the reaction products are the negative-acting diazonium compounds known and commonly used in the lithographic art. Broadly they are diazo-aromatics, and more particularly diazo-arylamines, that can be substituted on the aromatic nucleus or on the amino-nitrogen. The most commonly used of such diazo compounds is para-diazo-diphenylamine and derivatives thereof, especially reacted with organic condensing agents containing reactive carbonyl groups, such as aldehydes and acetals, particularly with compounds such as formaldehyde and para-formaldehyde. The preparation of some such eminently suitable condensation products is disclosed in U.S. Pat. Nos. 2,922,715 and 2,946,683.

To form the light-sensitive substantially water-insoluble diazonium coating components, the diazo-aromatic compounds mentioned above preferably are reacted with aromatic or aliphatic compounds having one or more phenolic hydroxyl groups or sulfonic acid groups $—SO_3$, or both. Examples of reactants having phenolic hydroxyl groups are hydroxy benzophenones, diphenolic acids such as 4,4-bis(4'-hydroxyphenyl)-pentanoic acid, resorcinol and diresorcinol, which can be further substituted. Hydroxy-benzo-phenones include 2,4-dihydroxy-, 2-hydroxy-4-methoxy-, 2,2'-dihydroxy-4,4'-dimethoxy- and 2,2',4,4'-tetrahydroxybenzophenone. Preferred sulfonic acids are those of the aromatic series, particularly of benzene, toluene, xylene, naphthalene, phenol, naphthol and benzophenone, and the soluble salts thereof such as the ammonium and the alkali metal salts. The sulfonic acid group-containing compounds generally can be substituted by lower alkyl, nitro and halo groups as well as additional sulfonic acid groups. Examples of such compounds include benzene sulfonic acid, toluene sulfonic acid, naphthalene sulfonic acid, 2,5-dimethyl-benzene sulfonic acid, benzene sodium sulfonate, naphthalene-2-sulfonic acid, 1-naphthol-2-(or 4-)-sulfonic acid, 2,4-dinitro-1-naphthol-7-sulfonic acid, 2-hydroxy-4-methoxy-benzophenone-5-sulfonic acid, m-(p'-anilinophenylazo)-benzene sodium sulfonate, alizarin sodium sulfonate, o-toluidine-m-sulfonic acid and ethane sulfonic acid.

The diazo compound and the coupling agent are reacted together, preferably in aqueous solution at a pH of below about 7.5, in approximately equimolar quantities. The reaction product is usually isolated as a precipitate, and can be coated by common techniques onto appropriate lithographic base sheets to form sensitized plates, as described, for example, in U.S. Pat. No. 3,300,309.

Illustrative of the positive-acting diazo-sensitized photosensitive coatings on substrates are those described in U.S. Pat. No. 3,544,317 of T. Yonezawa.

An essential active ingredient of the developer compositions of this invention is an amphoteric surfactant. Amphoteric surfactants are so named because they contain both an anionic and a cationic group. They behave as cationic surfactants in acid media and anionic surfactants in alkaline solutions.

A characteristic property of amphoteric surfactants is the fact that they possess an isoelectric point where the product is internally neutralized and a zwitterion is formed. At this point, amphoterics frequently exhibit a minimum solubility, foam, wetting, and surface tension reduction. In neutral or slightly alkaline solutions they exhibit the high foaming and detergency properties of anionic surfactants while showing substantivity to fibers, metal, etc. usually associated with cationic agents.

The cationic character of amphoterics is due to a basic nitrogen which may be present as a primary, secondary, tertiary or quaternary nitrogen group. The anionic portion may be derived from a carboxyl, sulfate, sulfonate or phosphate radical.

In order for amphoteric materials to function effectively as surfactants, they should contain an alkyl group having from about 6–20 carbon atoms.

Illustrative of the amphoteric surfactants which may be used in the developer compositions of this invention are those based on substituted imidazolines such as the Monaterics available from Mona Industries, Inc., Paterson, N.J. The imidazoline surfactants may be prepared by reacting long chain imidazolines with halogenated or organic intermediates containing carboxyl, phosphoric, or sulfonic acid groups. Other imidazoline-based surfactants that may be used are, e.g.,

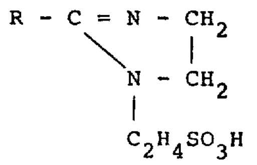

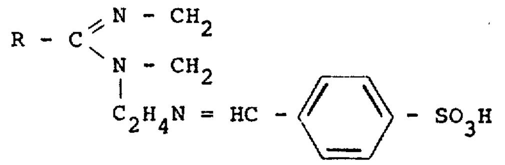

and their sodium salts, wherein R is as hereinafter described. This group of amphoteric surfactans is preferred in the developer compositions of this invention.

Another class of amphoteric surfactants which may be used are β-alanine derivatives characterized by the following formulae:

$$RNHCH_2CH_2COOX$$

and $$RN(CH_2CH_2COOX)_2$$

In these formulae, R represents an aliphatic hydrocarbon chain of from about 6 to 20 carbon atoms such as octyl, nonyl, decyl, undecyl, dodecyl, tridecyl, tetradecyl, pentadecyl, hexadecyl, heptadecyl and octadecyl; X represents hydrogen or a cation such as an alkali metal, e.g., sodium, potassium, lithium, ammonium or an organic amine cation such as diethanolamine, triethylamine, triethanolamine, morpholine or piperidine. These compounds are prepared by reacting a primary amine having from about 6 to 20 carbon atoms with chloropropionic or bromopropionic acid in the presence of an alkali such as sodium hydroxide or potassium carbonate.

The compounds can also be prepared in accordance with the method described in U.S. Pat. No. 2,468,012 by condensing at 25°–30°C., a primary amine containing from 6 to 20 carbon atoms with methyl acrylate to form the β-alkylaminopropionate. The methyl ester is hydrolyzed to an acid or converted to the alkali or organic amine salts by the conventional method of saponification. The secondary amine is obtained by the use of molar proportions whereas the tertiary amine is obtained by using at least two molar equivalents of the acid derivatives.

In the selection of the amines, it is usually more economical to select those with an even number of hydrocarbon atoms because they are commercially available. The mixtures of amines obtained from coconut, soybeans or tallow may be used with equal success. Other compounds which may be used include the following:

$C_{12}H_{23}NH.CH_2CH_2COONa$

Sodium N-dodecyl-β-aminopropionate $C_{10}H_{21}NH.CH_2CH_2COOH$

N-decylβ-aminopropionic acid $C_{14}H_{29}NH.CH_2CH.COOK$

Potassium N-tetradecylβ-aminopropionate $C_{16}H_{33}NH.CH_2CH_2COONa$

Sodium N-hexadecylβ-aminopropionate $C_{18}H_{37}NH.CH_2CH_2COONa$

Sodium N-octadecylβ-aminopropionate

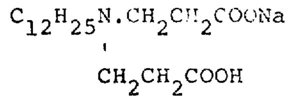

Monosodium salt of N-dodecylβ-aminodipropionate

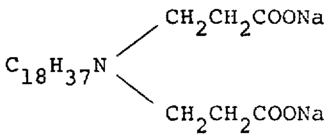

Disodium N-octadecylβ-aminodipropionate

Another class of amphoteric surfactants which may be used comprises the betaine derivatives which contain a long hydrocarbon chain. These betaine derivatives are characterized by the following formula:

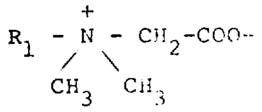

in which $R_1$ represents an aliphtic hydrocarbon radical of from about 6 to 20 carbon atoms. These betaine compounds are prepared by reacting a tertiary higher alkyl amine such as dodecyldimethylamine, tetradecyldimethylamine or hexadecyldiethylamine with chloroacetic acid. These compounds can also be prepared by condensing the tertiary amine with a halogenated carboxylic ester and saponifying the ester as described in U.S. Pat. No. 2,082,275.

The amphoteric surfactants of this invention may be used either alone or in conjunction with other surfactants or wetting agents; such as, the taurines, saponin or polyoxyethylene derivatives of long chain fatty acids and alcohols.

Illustrative of the organo-lithium salts used in the developers of this invention are the lithium salts of organic compounds having an acidic hydrogen and containing one (1) to about thirty-six (36) carbon atoms. Examples of organic compounds having acidic hydrogens are those containing carboxylic acid, sulfonic acid, sulfuric acid, and phenolic hydroxyl groups, etc. More specifically illustrative of the lithium salts are those which may be represented by the following general formulas:

I. $M(CH_2)_a(CH{=}CH)_b(CHSO_3Li)_c\overset{O}{\overset{\|}{C}}{-}O{-}Li$

II. $M(CH_2)_a(CH{=}CH)_b(CH_3SO_3Li)_cC{-}O{-}SO_3{-}Li$

III. Dimers of compounds of Formula I or II or I and II can be prepared via a procedure utilizing a Diels-Alder reaction. The lithium salts have idealized formulas such as:

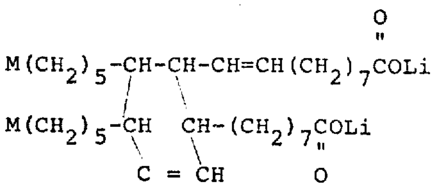

The dimerized fatty acid precursors are available from Emery Industries, Inc.

In formulas, I, II and III, M=H, —OH, —COOH, $-\overset{O}{\overset{\|}{C}}OLi,$ —C—O—$S_3$-Li, $CH_3$; *a*=*an* integer having a value of 0 to 17; *b*=an integer having a value of 0 to 3; *c*=an integer of from 0 to 3; the sum of *b* and *c* = an integer from 0 to 3; and the sum of *a, b* and *c* may have a maximum value of 17 when M=H or —OH, or 16 when M is any other group.

IV.

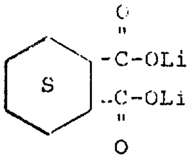

V.

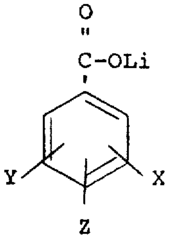

VI.

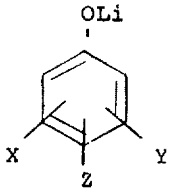

VII.

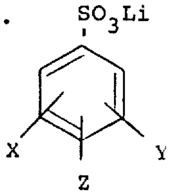

VIII.

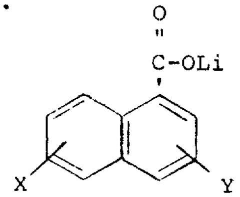

IX.

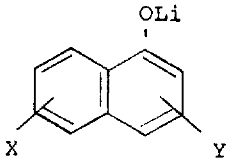

X.

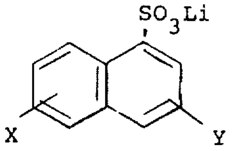

In Formulas IV to X, X or Y or Z may independently be H, —OLi, —$SO_3Li$ or $$-\overset{O}{\overset{\|}{C}}-OLi,$$

—OH,—$NO_2$, Cl, Br, —COOH, or $CH_3(CH_2)_d$ in which *d* may be an integer having a value of 0 to 17.

In addition to the functional groups indicated in the formulas above the lithium salts may contain in their organic moieties other functional groups which do not adversely affect their performance in the developer compositions of this invention, e.g., hydroxy, methoxy, ethoxy, nitro, halogen, etc.

Illustrative of specific water soluble lithium salts which may be used in the novel developer compositions of this invention are lithium formate, lithium chloroacetate, lithium dichloroacete, lithium trichloroacetate, lithium benzoate, lithium naphthenates, lithium dodecanoate, lithium ricinoleate, lithium lauryl sulfonate, lithium acetyl salicylate, lithium lauryl sulfate, lithium phenolate, lithium 1-phenanthrolate, lithium 0-nitrophenolate, dilithium catecholate, lithium 2,4,6-trinitrobenzoate, lithium phenol sulfonate, lithium picrate, lithium toluene sulfonate, lithium xylene sulfonate, lithium resorcinoleates, lithium xylenolates, lithium caprylates, the mono and dilithium salts of dicarboxylic acids such as citric acid, maleic acid and malic acid; lithium stearate, lithium oleate, lithium p-nitrotoluene-ortho-sulfonates, lithium toluene sulfonate, lithium 1-butane sulfonate, lithium benzene sulfonate, lithium dodecylbenzene sulfonate, lithium 2,5-dichloro-benzene sulfonate, lithium 2,4-dinitro-1-naphthol-7-sulfonate, lithium salt of sulfonated castor oil (Napco Oil 1408), and the like.

Preferably the organic compounds contain from about 2 to about 36 carbon atoms, more preferably from about 4 to about 36 carbon atoms and most preferably from about 7 to about 18 carbon atoms.

The most preferred lithium salts are lithium benzoate, lithium phenol sulfonate, lithium lauryl sulfate and lithium dodecanoate.

There appears to be no limitation on the amount of organo-lithium compounds in the developer solutions other than those dictated by practical consideration. For example, economics and the solubility of the compound in water or the aqueous developer system governs a practical upper limit of concentration, whereas time of development principally governs the lower limit. For example, at concentrations of about 1%, the development time is in the order of about five or more minutes, which from a busy lithographer's standpoint is inordinately long compared to the roughly one-half minute to about two minutes that he finds desirable. That desired range of time can be obtained with the instant developing systems at solution concentrations of from about 5% to about 25% by weight of organo-lithium compound in solution. The preferred range of concentration is about 10% to about 20%, which gives good development time, in the order of about one minute, and also provides sufficient water for dissolution and removal of the unexposed coating without the need for excessive rinsing.

There appears to be no limitation on the amount of amphoteric surfactant in the developer solutions other than those dictated by practical consideration. For example, economics and the solubility of the compound in water or the aqueous developer system governs a practical upper limit of concentration, whereas time of development principally governs the lower limit. For example, at concentrations of about 1%, the development time is in the order of about five or more minutes, which from a busy lithographer's standpoint is inordinately long compared to the roughly one-half minute to about two minutes that he finds desirable. That desired range of time can be obtained with the instant developing systems at solution concentrations of from about 5% to about 30% by weight of amphoteric surfactant in solution. The preferred range of concentration is about 10% to about 20%, which gives good development time, in the order of about one minute, and also provides sufficient water for dissolution and removal of the unexposed coating without the need for excessive rinsing.

The developer composition of this invention may be formulated in a concentration in water which is directly useful for developing lithographic plates, or it may initially be formulated as a concentrate, i.e., an aqueous solution in which the active ingredients are present at a concentration higher than necessary for use as a developer. This is advantageous for shipping and storage purposes. Before use the concentrate should be diluted with water to the preferred working concentration. The concentrate may be up to about three times more concentrated than the working solution. In the concentrate, the amphoteric surfactants and organo-lithium salts may each be present in an amount from about 15% to about 50%.

It may be desirable to also include in the developer solutions additional ingredients to facilitate development and to provide plate treatment. Such ingredients are, e.g., solvents, wetting agents or surfactants, metal cleaners, etc. For example, although not necessary, up to about 30% by weight of a solvent miscible with the water is helpful to assist removal from the non-image area of the diazonium compound or especially to help dissolve organic resin either admixed with the diazonium compound in the coating on the plate or as a coating on top of the diazonium compound. The solvent is also helpful as a penetrant, especially instead of all or a part of a conventional surfactant wetting agent when the developer is to be used in a developing machine where the conventional wetting agent would have a tendency to foam undesirably. Preferably, there is used up to about 25%, more preferably up to about 20% and most preferably from about 5% to 15% of solvents such as cyclohexanone, benzyl alcohol, dimethylformamide, dimethylsulfoxide, normal propyl alcohol, isopropanol, dioxane and methyl Cellosolve, etc. Surfactants, or wetting agents, to promote contact between the aqueous developer and the light-sensitive coating can be used in amounts up to about 5% or 10% by weight.

The wetting agents which may be used in the novel developer compositions of this invention may be nonionic, anionic or cationic. Developer compositions containing organo-lithium salts are the subject of an application of W. Rowe and E. Golda filed Nov. 2, 1972, Ser. No. 302,994. Developer compositions containing amphoteric surfactants are the subject of an application of L. Katz W. Rowe and E. Golda filed Nov. 2, 1972 Ser. No. 303,072.

Illustrative of the wetting agents which may be used are:

Anionic

Such agents include ammonium and alkali metal salts of long-chain alochol sulfates, for example, sodium lauryl sulfate, sodium octyl sulfate, ammonium lauryl sulfate, sodium N-methyl-oleyl taurate, dioctyl sodium sulfosuccinate, sodium dodecylbenzene sulfate.

Sodium di(2-ethylhexyl) phosphate [Tergitol P-28 (Union Carbide)]

Duponol series (du Pont) [generally sodium alkyl sulfates]

Duponol Ep, a liquid alkyl alkylolamine sulfate (du Pont)

Avirol 116 (Henkel, Inc.) [sodium lauryl ether sulfate needles]

Avirol 111 LC (Henkel, Inc.) [liquid sodium alkyl sulfate], etc.

Nonionic

Tergitol 15-S-3 (Union Carbide) [a liquid polyethylene glycol ether of a linear alcohol having an HLB* of 8.0]

Tergitol NPX (Union Carbide) [a liquid nonylphenyl polyethylene glycol ether having an HLB* of 13.6]

Tergitol NP-35 (Union Carbide) [a paste nonylphenyl polyethylene glycol ether having an HLB* of 15.0]

Gaftex Texol 237 (GAF Corporation) [a diethanolamine lauric acid condensate]

Glycerol monostearate

Polyoxyethylene glycol monostearate

*Hydrophil-Lipophil Balance

Cationic

Gafstats (GAF) [quaternary ammonium derivatives]

Aerosol C 61 (American Cyanamid Co.) [an ethanolated alkylguanidine amine complex] etc.

The most preferred wetting agents are the anionics, nonionics are next and then cationics. Of the anionics, the alkyl alkylolamine sulfates and sodium lauryl ether sulfates are preferred. Of the nonionics, the first three listed above are preferred.

It is preferred that the wetting agents, particularly the nonionic ones, have a hydrophil-lipophil balance (HLB) of at least about 8.

The developer compositions of this invention may also contain the aromatic or aliphatic compounds having a sulfonic acid group —$SO_3$—, which are used in the developer compositions described in U.S. Pat. No. 3,669,660 of E. Golda and A. Taudien.

Such compounds in general are the same as the ones previously described as being suitable for making, with the diazo compound, the light-sensitive reaction product that is in the sensitized coating on the plate. Examples of such compounds include benzene sulfonic acid, toluene sulfonic acid, naphthalene sulfonic acid, 2,5-dimethyl-benzene sulfonic acid, benzene sodium sulfonate, naphthalene-2-sulfonic acid, 1-naphthol-2-(or -4-)-sulfonic acid, 2,4-dinitro-1-naphthol-7-sulfonic acid, 2-hydroxy-4-methoxybenzo-phenone-5-sulfonic acid, m-(p'-anilino-phenylazo)-benzene sodium sulfonate, alizarin sodium sulfonate, o-toluidine-m-sulfonic acid and ethane sulfonic acid. The sulfonic acid group containing compounds are dissolved in water to form developer solutions.

Certain formulations of the developers of this invention evidence unique synergistic effects. For example, the amphoteric surfactant moderates the action of solvents. A developer composition containing 5% of an amphoteric surfactant and 23% of solvent is effective in removing non-image areas from the diazo-sensitized coating, but does not adversely affect the image area.

However, if the percent of amphoteric surfactant in the formulation is halved, the developer composition attacks the image area of the coating. The amphoteric surfactant speeds up the action of other components of developer formulations, e.g., the sulfonic acids and their sodium or lithium salts mentioned above.

Up to about 5% by weight of phosphoric acid or oxalic acid can also be used in the developer composition of this invention as agents to clean the aluminum base sheet after the desensitized coating is removed. Other similar agents known in the art can, in general, also be used if desired.

The pH's of the developers of this invention generally range from approximately neutral, i.e., a pH of about 5 to about 10, and some range as high as 11 or 12 or higher. This wide pH range affords a great latitude for developer formulation without adverse effect on the activity or efficiency of the developer. It is well known that at increasingly alkaline pHs there is a tendency for diazo compounds to irreversibly couple and become relatively insoluble. If an alkaline developer were to indiscriminately harden both image and non-image areas of a diazo lithographic plate it would not be considered an effective developer. It is surprising that the developers of this invention, which range in alkalinity up to a pH of approximately 11 or 12, are successful in faithfully developing lithographic plates. In view of the tendency for diazo compounds to couple under alkaline conditions, many of the prior art developers which utilized for example, sodium salts of aromatic sulfonic acids contained excess phosphoric, oxalic, citric or sulfonic acid or any other acid, which was used in order to obtain a low pH.

The developers of this invention may be applied to exposed photosensitive coatings, particularly diazo-sensitized coatings, either manually or by machine. The sophisticated formulator will, of course, formulate the developer composition in accordance with the teachings of this invention to develop the particular exposed coating, whether it be on a lithographic printing plate (either presensitized or of the wipe-on kind) or on any other surface, e.g., paper or a clear plastic film as in a proofing system to proof color separation transparencies. The developer formulations of this invention are universal in that they are useful in developing positive-acting systems, and are particularly useful and efficient in developing negative-acting systems. For developing positive-acting systems it is preferred that the developer be on the alkaline side, preferably at a pH of at least about 12, but lower pHs may also be used. In view of the universality of the developers of this invention, it is possible for the lithographer to use one developer composition for both negative and positive-working systems. The use of a single developer for both systems is particularly useful and time-saving when a developing machine is used. The use of a single developer means that it is not necessary, e.g., to drain a negative system developer, rinse the machine and then fill with a positive system developer, to develop the different kinds of systems. Universality is extended to more kinds of plates, especially those having coatings containing organic resins, if the developers also contain solvents.

It is to be understood that the following examples are given merely to illustrate the invention, and that modifications of the ingredients, proportions and conditions can be made by persons skilled in the art without departing from the scope of the invention as described hereinbefore and as defined in the appended claims.

In the following Examples all parts and percentages are by weight.

EXAMPLE 1

The first plate in Table I which follows was made in the following manner.

One surface of an aluminum plate was brush-grained, anodized and chemically treated with potassium zirconium fluoride to form a coating which functions as an interlayer in the finished plate. The treated plate surface was then coated with a light-sensitive coating comprising: 4 parts of sensitizer (addition product of 2-hydroxy-4-methoxy-benzophenone-5-sulfonic acid and para-diazo diphenyl amine-formaldehyde condensate) and 1 part of a glycidyl ether polyepoxide. The coating on the plate had a weight of about 50 mg/ft.$^2$. After exposure of the plate (which had been aged about 3 months) to ultraviolet light for two minutes through a negative transparency, unexposed areas of the plate were easily removed with the indicated developer formulation to yield commercially acceptable lithographic plates.

TABLE I

AMPHOTERIC UNIVERSAL DEVELOPER

DEVELOPER COMPOSITION:
- a) 10% Sodium salt of 2-caprylic-1 (ethyl beta oxipropanoic acid) imidazoline
- b) 5% Lithium Benzoate
- c) 20% Normal Propyl Alcohol
- d) 40% Benzyl Alcohol
- e) 25% Water

EXPOSURE 2 MINUTES NU ARC

| PLATE | DESIGNATION | AGE | TRANSPARENCY | LINE SCREEN | DOT QUALITY | GRAY SCALE | DOT RETENTION | BACKGROUND | PRESS |
|---|---|---|---|---|---|---|---|---|---|
| 4 Sensitizer 1 Glycidyl ether polyepoxide | | 3 Months | Negative | 133 5–90% | Good | Solid 4 Tail 7 | Good | Clean | 5,000 copies good reproduction |
| 3M | S | ? | Negative | 133 5–90% | Good | Solid 8 Tail 9 | Good | Clean | |
| 3M | K | ? | " | " | " | Solid 7 Tail 8 | " | " | |
| 3M | T | ? | " | " | " | Solid 9 Tail 10 | " | " | |
| Enco | N-25 | ? | " | " | " | Solid 10 Tail 12 | " | " | |
| Enco | N-50 | ? | " | " | " | Solid 9 Tail 11 | " | " | |

TABLE I – Continued

AMPHOTERIC UNIVERSAL DEVELOPER

DEVELOPER COMPOSITION:
a) 10% Sodium salt of 2-caprylic-1 (ethyl beta oxipropanoic acid) imidazoline
b) 5% Lithium Benzoate
c) 20% Normal Propyl Alcohol
d) 40% Benzyl Alcohol
e) 25% Water

| | | | | | | | | |
|---|---|---|---|---|---|---|---|---|
| Enco | N-100 | ? | " | " | " | Solid 9<br>Tail 11 | " | " |
| Enco | PA-200 | ? | Positive | " | " | Solid 10<br>Tail 4 | " | " |
| Enco | PA-400 | ? | " | " | " | Solid 9<br>Tail 5 | " | " |
| duPont | Lydel | ? | Negative | " | " | Solid 6<br>Tail 9 | " | " |

Table I above gives data on press performance of plates developed with the different developer compositions. The method of development was by hand application of the developer with an applicator pad. The image areas and nonimage areas are described. The grey scale used is a continuous tone 21-step guide which is available from Stouffer Graphic Arts Equipment Company (South Bend, Ind.). The press run was conducted by locking-up the plate on a Chief 22 lithographic press which was 0.006 inch "over-packed," by which is meant that the plate was shimmed-up to 0.006 inch higher than normal, thereby causing the plate to contact the rollers with a pressure greater than would normally be used. Over-packing causes excessive wear of the plate compared to what would occur on a properly adjusted press. The fountain solution contained 35% isopropanol. Usually fountain solutions contain no more than 25% alcohol. The more alcohol in the fountain solution, the greater the adverse effect on the image area of the plate that can be expected. The ink used was Chromatone No. 4559 (a product of Chromatone Printing Ink Company, a subsidiary of Polychrome Corporation). The paper used was 70 lb. white offset paper which was reused a maximum of three times. 5,000 copies were printed and the quality of the printing was as indicated in the column of the Table entitled "Press Run."

EXAMPLE 2

Table II which follows gives data on press performance of plates developed with a different developer composition.

a. An aqueous solution comprised of;
   1. from 5% by weight to 30% by weight of an amphoteric 2-alkyl substituted imidazoline surfactant with 1-position substitution containing a halogen atom, carboxyl, phosphoric or sulfonic acid group, wherein the alkyl group contains from 6 to 20 carbon atoms; and
   2. from 5% by weight to 25% by weight of a water soluble organo-lithium salt, which is the water soluble lithium salt of an organic compound having from 1 to 36 carbon atoms and at least 1 acidic hydrogen; and
b. said aqueous composition having a pH of from about 5 to about 12 and being capable, when applied to an exposed diazo-sensitive photosensitive coating of a lithographic plate, of removing the non-image areas therefrom, all percentages being based on the total weight of the ingredients in the developer solution.

2. A developer composition according to claim 1 wherein said amphoteric surfactant is a 2-alkyl-1 (ethyl beta oxipropanoic acid) imidazoline wherein the alkyl group contains from about 6 to about 20 carbon atoms.

3. A developer composition according to claim 1 wherein the alkyl group contains from about 6 to about 18 carbon atoms.

4. A developer composition according to claim 1 wherein said amphoteric surfactant is the sodium salt of 2-caprylic-1 (ethyl beta oxipropanoic acid) imidazoline or the inner salt of 2-coconut-1- (ethyl beta oxipropanoic acid) imidazoline.

TABLE II

AMPHOTERIC & LITHIUM BENZOATE

DEVELOPER COMPOSITION:
a) 20% Sodium salt of 2-caprylic-1 (ethyl beta oxypropanoic acid) imidazoline
b) 5% Lithium Benzoate
c) 75% Water

EXPOSURE 2 MINUTES NU ARC (CARBON ARC)

| PLATE | AGE | TRANSPARENCY | LINE SCREEN | DEVELOPMENT QUALITY | GREY SCALE | DOT RETENTION | BACKGROUND | PRESS |
|---|---|---|---|---|---|---|---|---|
| Same as first in Table I | 3 Months | Negative | 133<br>5–90% | Good | Solid 4<br>Tail 8 | Good | Good | 5,000<br>Good |

What we claim is:

1. A developer composition for lithographic printing plates which comprises;

5. A developer composition according to claim 1 wherein said composition contains from about 5% to about 25% by weight of said amphoteric surfactant, all percentages being based on the total weight of the ingredients in the developer solution.

6. A developer composition according to claim 5 wherein said amphoteric surfactant is 2-caprylic-1-(ethyl beta oxipropanoic acid)-imidazoline.

7. A developer composition according to claim 1 wherein the organo-lithium salt contains from about 4 to about 36 carbon atoms.

8. A developer composition according to claim 1 wherein the organo-lithium salt contains from about 7 to about 18 carbon atoms.

9. A developer composition according to claim 1 wherein said organo-lithium salt is lithium formate, lithium chloroacetate, lithium dichloroacete, lithium trichloroacetate, lithium benzoate, lithium naphthenates, lithium dodecanoate, lithium ricinoleate, lithium lauryl sulfonate, lithium acetyl salicylate, lithium lauryl sulfate, lithium phenolate, lithium 1-phenanthrolate, lithium o-nitrophenolate, dilithium catecholate, lithium 2,4,6-trinitrobenzoate, lithium phenol sulfonate, lithium picrate, lithium toluene sulfonate, lithium xylene sulfonate, lithium resorcinoleates, lithium xylenolates, lithium caprylates, the mono and dilithium salts of citric acid, maleic acid or malic acid; lithium stearate, lithium oleate, lithium p-nitrotoluene-orthosulfonates, lithium toluene sulfonate, lithium 1-butane sulfonate, lithium benzene sulfonate, lithium dodecylbenzene sulfonate, lithium 2,5-dichlorobenzene sulfonate, or lithium 2,4-dinitro-1-naphthol-7-sulfonate,

10. A developer composition according to claim 1 wherein said composition contains up to about 30% by weight of a solvent for said photosensitive coating that is miscible in water, up to about 10% by weight of a nonionic, anionic or cationic surfactant, or up to about 5% of phosphoric acid or oxalic acid, all percentages being based on the total weight of the ingredients in the developer solution.

11. A developer composition according to claim 10 wherein said composition contains benzyl alcohol, normal propyl alcohol, isopropanol, cyclohexanone, dimethylformamide, dimethylsulfoxide, dioxane, or methyl Cellosolve.

12. A developer composition according to claim 1 wherein said composition contains up to about 25% by weight of a solvent for said photosensitive coating, all percentages being based on the total weight of the ingredients in the developer solution.

13. A developer composition according to claim 1 wherein said diazo-sensitized photosensitive, coating is on a negative-acting lithographic plate, and is substantially water-insoluble and substantially solvent soluble.

14. A developer composition according to claim 1 wherein said diazo-sensitized photosensitive coating is on a positive-acting lithographic plate, and the aqueous solution has a pH of at least about 12.

15. A developer composition according to claim 1 wherein said diazo-sensitized photosensitive coating is in a negative-acting proofing system, and is substantially water-insoluble and substantially solvent soluble.

16. A developer composition according to claim 1 wherein said diazo-sensitized photosensitive coating is in a positive-acting proofing system and the pH of the aqueous solution is at least about 12.

17. A developer composition according to claim 1 wherein said coating contains a reaction product of a diazoaromatic polymer and a hydroxyl-containing compound or a sulfonic acid-containing compound.

18. A developer composition according to claim 17 wherein the diazo-aromatic polymer is that obtained from para-diazo-diphenylamine and reactive carbonyl-containing compounds.

19. A composition adapted for developing an exposed-diazo-sensitized photosensitive coating on a substrate to remove therefrom non-image areas which comprises an aqueous solution of from 5% to 30% by weight of the sodium salt of 2-caprylic-1-(ethyl beta oxipropanoic acid) - imidazoline, from 5% to 25% by weight of lithium benzoate and from 5% to 25% by weight of a water-miscible solvent, all percentages being based on the total weight of the ingredients in the developer solution.

20. A developer composition adapted for developing exposed diazo-sensitized photosensitive coatings on a substrate to remove therefrom non-image areas which comprises an aqueous solution having a pH of at least 5 from 5% to 25% by weight of a 2-alkyl-1 (ethyl betaoxipropanic acid) imidazoline wherein the alkyl group contains from about 6 to about 20 carbon atoms and from about 5% to 25% by weight of lithium benzoate, all percentages being based on the total weight of the ingredients in the developer solution.

21. The developer composition of claim 20 wherein the pH of said aqueous solution is at least 5.

* * * * *